United States Patent
Mandelman et al.

(10) Patent No.: US 6,348,394 B1
(45) Date of Patent: Feb. 19, 2002

(54) METHOD AND DEVICE FOR ARRAY THRESHOLD VOLTAGE CONTROL BY TRAPPED CHARGE IN TRENCH ISOLATION

(75) Inventors: Jack A. Mandelman, Stormville; Rama Divakaruni, Somers; Herbert Ho, Cornwall; Giuseppe La Rosa, Fishkill; Yujun Li, Poughkeepsie; Jochen Beintner, Wappingers Falls, all of NY (US); Radhika Srinivasan, Mahwah, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/573,375

(22) Filed: May 18, 2000

(51) Int. Cl.[7] ............................................. H01L 21/76
(52) U.S. Cl. ...................... 438/424; 438/296; 438/435; 257/510
(58) Field of Search ................................ 438/424, 427, 438/435, 296; 257/510

(56) References Cited

U.S. PATENT DOCUMENTS

| | | |
|---|---|---|
| 3,899,363 A | 8/1975 | Dennard et al. |
| 4,504,333 A | 3/1985 | Kurosawa |
| 4,538,343 A | 9/1985 | Pollack et al. |
| 4,952,524 A | 8/1990 | Lee et al. |
| 4,960,727 A | 10/1990 | Mattox et al. |
| 5,148,247 A | 9/1992 | Miura et al. |
| 5,240,875 A | 8/1993 | Tsou |
| 5,296,392 A | 3/1994 | Grula et al. |
| 5,445,989 A | 8/1995 | Lur et al. |
| 5,447,884 A | 9/1995 | Fahey et al. |
| 5,516,721 A | 5/1996 | Galli et al. |
| 5,573,973 A | 11/1996 | Sethi et al. |
| 5,624,859 A | 4/1997 | Liu et al. |
| 5,747,866 A | 5/1998 | Ho et al. |
| 5,763,315 A | 6/1998 | Benedict et al. |
| 5,976,951 A * | 11/1999 | Huang .......................... 438/435 |
| 6,033,970 A * | 3/2000 | Park ............................ 438/435 |
| 6,046,487 A * | 4/2000 | Benedict et al. ............. 257/510 |

FOREIGN PATENT DOCUMENTS

JP            200133702    *  5/2000    ........... H01L/21/76

OTHER PUBLICATIONS

Hwang et al Thickness and Polarity Dependence of Intrinsic Breakdown of Ultra–Thin–Reoxidized–Nitride for DRAM Technology Applications IEEE 1997 pp. 4.2.1–4.2.4.*

* cited by examiner

Primary Examiner—Charles Bowers
Assistant Examiner—David S Blum
(74) Attorney, Agent, or Firm—Connolly Bove Lodge & Hutz, LLP; Daryl K. Neff

(57) ABSTRACT

A semiconductor device and method of manufacturing thereof are provided. A trench is formed in a semiconductor substrate. A thin oxide liner is preferably formed on surfaces of the trench. A nitride liner is formed in the trench. Charge is trapped in the nitride liner. In a preferred embodiment, the trench is filled with an oxide by an HDP process to increase the amount of charge trapped in the nitride liner. Preferably, the oxide fill is formed directly on the nitride liner.

21 Claims, 8 Drawing Sheets

FIG. 7

| SPLIT | | WAFER | ANDELTAL 797 | | | ANOMCHS1 668 | | | ANOMCOS1 670 | | |
|---|---|---|---|---|---|---|---|---|---|---|---|
| | | | 2% | 50% | 98% | 2% | 50% | 98% | 2% | 50% | 98% |
| 70Å | | MM18TC5 | −0.076 | −0.048 | −0.027 | 0.527 | 0.825 | 0.954 | 0.447 | 0.739 | 0.867 |
| | | MN18QV5 | −0.077 | −0.041 | −0.016 | 0.712 | 0.856 | 0.965 | 0.628 | 0.770 | 0.872 |
| | | ALL | −0.076 | −0.045 | −0.022 | 0.619 | 0.841 | 0.959 | 0.538 | 0.754 | 0.870 |
| 100Å | | MD18PN5 | −0.070 | −0.030 | −0.008 | 0.600 | 0.889 | 0.966 | 0.517 | 0.798 | 0.878 |
| | | MF18U15 | −0.074 | −0.040 | −0.013 | 0.309 | 0.889 | 1.004 | 0.203 | 0.800 | 0.916 |
| | | M318QF5 | −0.063 | −0.043 | −0.019 | 0.531 | 0.890 | 1.006 | 0.450 | 0.803 | 0.919 |
| | | ALL | −0.069 | −0.038 | −0.013 | 0.480 | 0.889 | 0.992 | 0.390 | 0.800 | 0.904 |
| 130Å | | MP18TA5 | −0.077 | −0.045 | −0.025 | 0.558 | 0.851 | 0.984 | 0.475 | 0.762 | 0.895 |
| | | M618ND5 | −0.080 | −0.037 | −0.014 | 0.643 | 0.815 | 0.964 | 0.559 | 0.724 | 0.877 |
| | | M618UA5 | −0.066 | −0.044 | −0.022 | 0.727 | 0.882 | 0.967 | 0.641 | 0.794 | 0.878 |
| | | ALL | −0.075 | −0.042 | −0.020 | 0.643 | 0.850 | 0.972 | 0.558 | 0.760 | 0.883 |
| ALL | | | −0.073 | −0.041 | −0.018 | 0.576 | 0.862 | 0.976 | 0.490 | 0.774 | 0.888 |

M2 PARAMETRICS — PARMT

US 6,348,394 B1

METHOD AND DEVICE FOR ARRAY THRESHOLD VOLTAGE CONTROL BY TRAPPED CHARGE IN TRENCH ISOLATION

BACKGROUND OF THE INVENTION

Trench isolation has been used in the semiconductor industry to reduce circuit topography and better isolate adjacent semiconductor devices. In a typical process of forming shallow trench isolation (STI), a nitride liner is formed on a thermally oxidized film on the surface of a shallow trench. The nitride liner has been shown to be a highly effective oxygen diffusion barrier. Thus, the nitride liner may be formed to prevent oxidation of a silicon sidewall of a collar region of a storage trench.

However, there are problems with the nitride liner as currently formed. The nitride liner has been shown to be a source of charge trapping, which leads to unacceptable levels of junction leakage in support circuitry. The charge trapping occurs at the interface of the nitride liner and the oxide used to fill the trenches. Many methods of handling charge trapping have been proposed. Most of the methods address the problem by reducing the charge trapped to improve isolation, rather than utilizing the charge to improve the device's operation. For example, U.S. Pat. No. 5,747,866 to Ho et al. describe a structure which limits charge trapping. Ho et al. describe a crystalline RTN nitride liner deposited at greater than 1050° C. to lower the density of trapping centers.

Another problem in forming the nitride liner is the process window for the nitride layer is extremely narrow. The nitride liner makes it easy for attachment to attack the near-top part of the trench and the near-corner part of the active layer during subsequent process steps. The nitride liner is inevitably etched when a pad nitride film is etched with hot phosphoric acid. It is difficult to control this isotropic etching of the near corner part of the active region. This, in turn, greatly affects the off-current of the device. The off current depends upon the conductivity of the corner parts of the active region, due to the reduced width of the semiconductor device and to the electric field concentrated at the corner parts of the active region. The off-current is influenced a great deal by the geometric shapes of the corner parts.

Thus, there is a need for a semiconductor device and manufacturing process that addresses the issues of charge trapping and off-current currently associated with forming the nitride liner.

SUMMARY OF THE INVENTION

A semiconductor device and method of manufacturing thereof are provided. A trench is formed in a semiconductor substrate. A thin oxide liner is preferably formed on surfaces of the trench. A nitride liner is formed in the trench. Charge is trapped in the nitride liner. In a preferred embodiment, the trench is filled with an oxide by an HDP process to increase the amount of charge trapped in the nitride liner. Preferably, the oxide fill is formed directly on the nitride liner.

DESCRIPTION OF THE DRAWINGS

The present invention will now be further described in the following pages of specification when taken in conjunction with the attached drawings, in which:

FIG. 7 is a table showing the effect of the oxide liner on Vt for a constant nitride liner thickness.

DETAILED DESCRIPTION OF THE INVENTION

The present invention provides a method of forming semiconductor devices with reduced off-currents. The invention is preferably implemented in the context of a DRAM array NMOSFET. Typically, a DRAM array NMOSFET includes NFET array devices formed in a p-well and NFET and PFET support devices.

The present invention reduces the off-current for a given p-well doping. The invention also permits reduced p-well doping for a given off-current. Reduced p-well doping improves semiconductor device characteristics, such as junction leakage characteristics, retention time yield, sub threshold slope, substrate sensitivity, and junction capacitance. The reduced p-well doping is achieved by utilizing charge trapped in a nitride liner. The charge trapped in the nitride liner can be used to adjust the threshold voltage of the device. Accordingly, the charge trapped in the nitride liner can be used as a design parameter of the device, in addition to the customary design parameters such as gate oxide thickness, channel/well doping, gate conductor work function, etc.

Typically, the array device is an NFET and the trapped nitride charge is negative. A DRAM array NMOSFET's minimum lithographic width allows the most benefit from the presence of negative charge in the nitride liner. Hence, the array corner threshold voltage is increased due to the narrow width of the array device. Since most support FETs are significantly wider than the array FETs, the presence of charge in the nitride liner will have much less of an effect on the threshold voltage of the support FETs. However, the trapped negative charge will reduce the magnitude of the corner threshold for PFET devices. This may be offset with a sidewall implant for the PFET devices to increase the magnitude of their corner threshold, or with other alternatives.

Charge trapping occurs in the nitride liner mainly due to process induced plasma charging. Therefore key process parameters, for example, HDP fill, GC etch, etc. should be optimized to set the array threshold voltage. Thus, the trapped charge may be used as a design parameter for an active MOSFET.

Figure 1A:
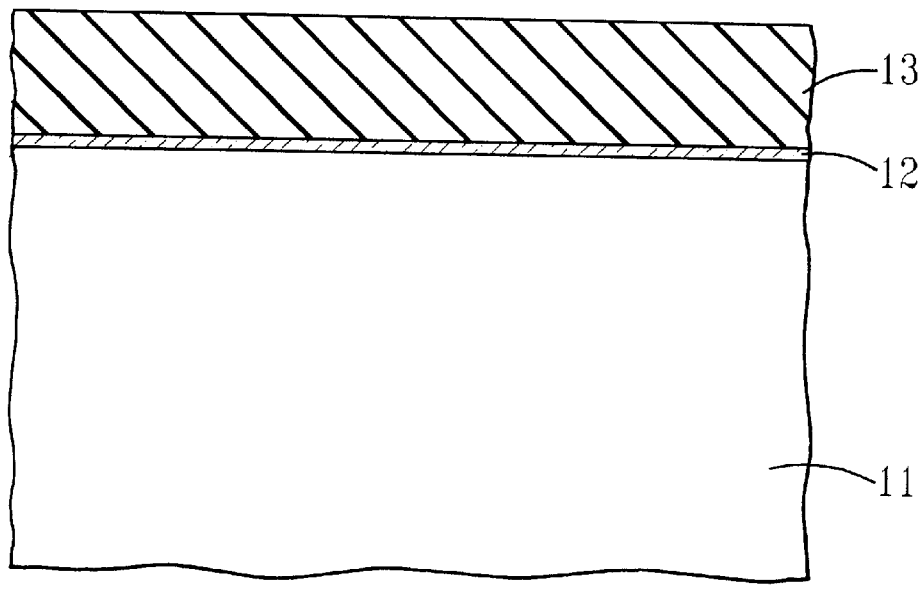
FIGS. 1A–1D are cross-sections of a semiconductor device explaining a process according to an embodiment of the invention.
Figure 1B:
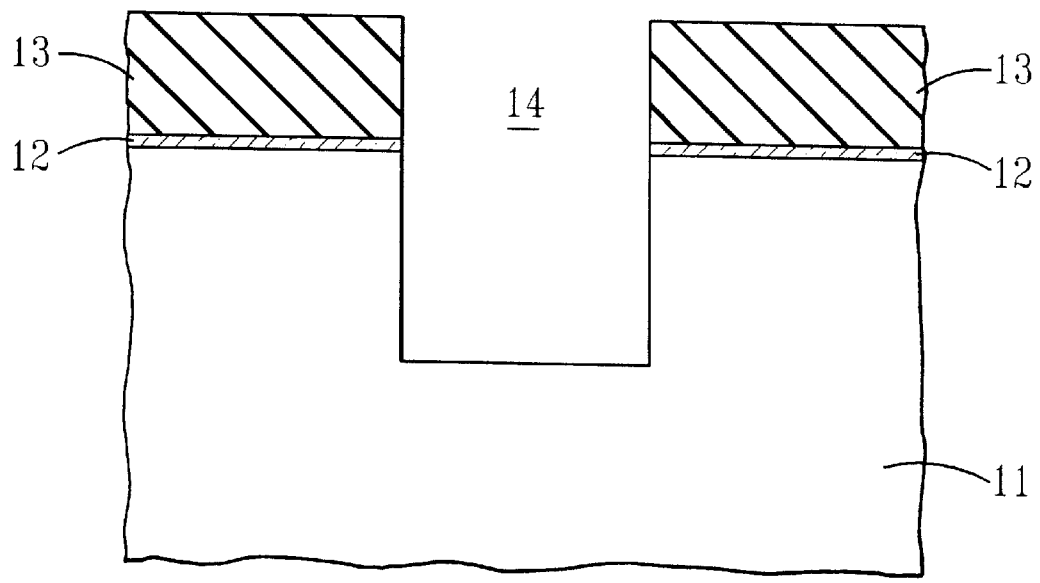

Turning now to FIGS. 1A–1D, a method according to an embodiment of the present invention will now be described. A semiconductor substrate 11 is provided. Normally, a pad oxide film 12 about 3 nm to 8 nm thick is formed on the substrate 11. A pad nitride film 13 about 100 nm to 250 nm thick is usually then formed on top of the pad oxide film 12, resulting in the structure shown in FIG. 1A. Next, the pad nitride film 13, pad oxide film 12 and substrate 11 are selectively etched by a known etching process. Trench 14 is thereby formed as shown in FIG. 1B. The above process is well known and can be carried out using conventional techniques.

Figure 1C:
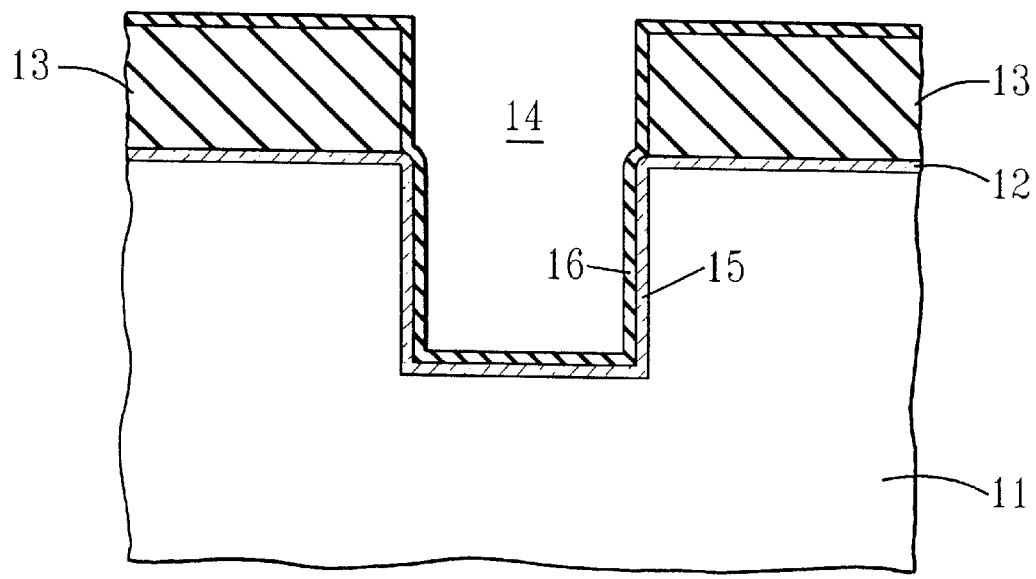

As shown in FIG. 1C, an oxide liner 15 may be formed in a conventional manner on surfaces of the trench 14. The oxide liner 15 is typically provided to passivate the surface of the substrate. Preferably, the oxide liner 15 is formed only on surfaces inside the trench 14. A nitride liner 16 may then be formed on the oxide liner 15. The nitride liner 16 should be a non-crystalline layer formed by LPCVD at 700°–800° C., RTCVD or other known processes. These processes are well known to one skilled in the art. Also, the nitride layer 16 may be formed both inside the trench 14 and on the pad nitride layer 13. The nitride liner 16 is formed to have charges trapped therein. The charges are preferably distributed throughout the entire nitride liner in the trench and change the threshold voltage of the device as described above. The formation of the semiconductor device may then be completed in a known manner.

Figure 1D:
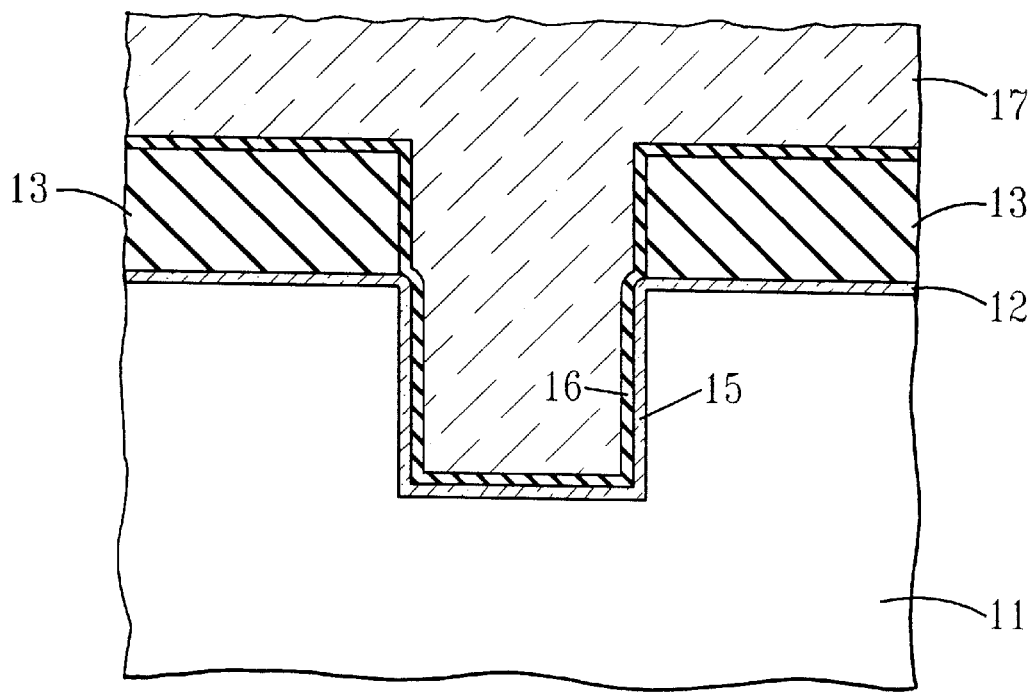

In a preferred embodiment, after the nitride layer 16 is formed, an oxide fill 17 is formed in the trench 14, see FIG. 1D. The oxide fill 17 forms isolations in the trench 14 and separates element active areas on the substrate in which transistors and other devices are formed. A HDP oxide fill has been found to enhance the concentration of negative charges trapped in the nitride layer. In HDP plasma processes, the plasma assumes a potential of approximately 10–12 volts. At elevated deposition temperatures, a p-type substrate has a much higher electron concentration than at room temperature. Therefore most of the voltage is dropped across the oxide and nitride liners. This creates a high electric field, which is favorable for tunneling of electrons into the nitride, where they are trapped. Accordingly, the oxide fill 17 is preferably a HDP oxide fill. Ideally, the HDP oxide fill is formed directly on the nitride liner 16.

As mentioned above, the trapped charge in the nitride liner has a particularly advantageous effect when the device is a DRAM array. The process of forming a DRAM array according to the invention is substantially the same as the process describe above. In such a device, the semiconductor substrate is divided into array regions and support regions. A number of trenches are etched into the substrate to isolate elements later formed. The nitride liner is formed in the trench and an oxide fill is then deposited in the trenches to form isolations. Preferably, the oxide fill is formed by an HDP process to increase the charge trapped in the nitride layer, as describe above. Next NFETs are formed in the array region and NFETs and PFETs are formed in the support region. The doping concentration of p-wells in the array region can be reduced as a function of the trapped negative charge in the nitride liner. For example, surface doping concentration reductions of typically 30%–50% from conventional device surface doping are achievable in the p-well without reducing device performance, see FIG. 8 discussed below.

Figure 2:
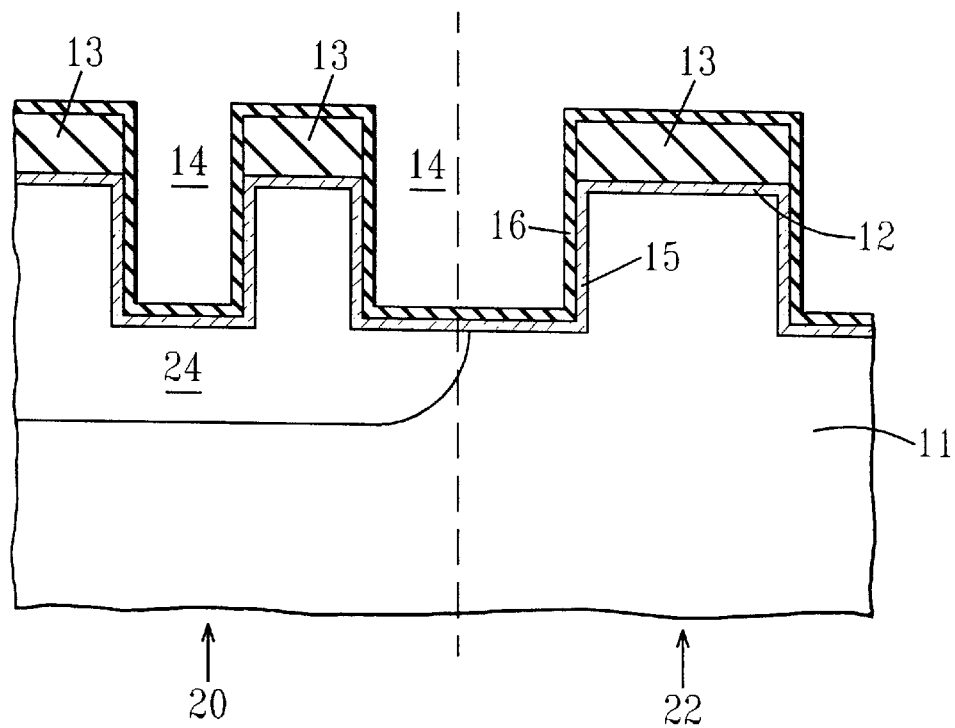
FIG. 2 is a cross-section of memory array being formed according to an embodiment of the invention.

FIG. 2 illustrates a method of the present invention used to form a DRAM array. Semiconductor substrate 11 is divided into a plurality of array regions 20 and a plurality of support regions 22. Trenches 14 have been etched into the substrate. A well 24, in this case a p-well, is formed in substrate 11 in the array region 20. Nitride liner 16 is formed in the trenches in both the array region 20 and the support region 22. A masked etch may be performed on the nitride liner 16 to remove it from areas where PFETs are to be formed. This protects the PFETs from being adversely effected by the trapped negative charge. Alternatively, the thickness of the oxide liner 15 and the nitride liner 16 may be chosen such that the PFET is completely aged by in-line charging. This would ensure no further movement of the PFET and provide a reliable device.

Figure 3:
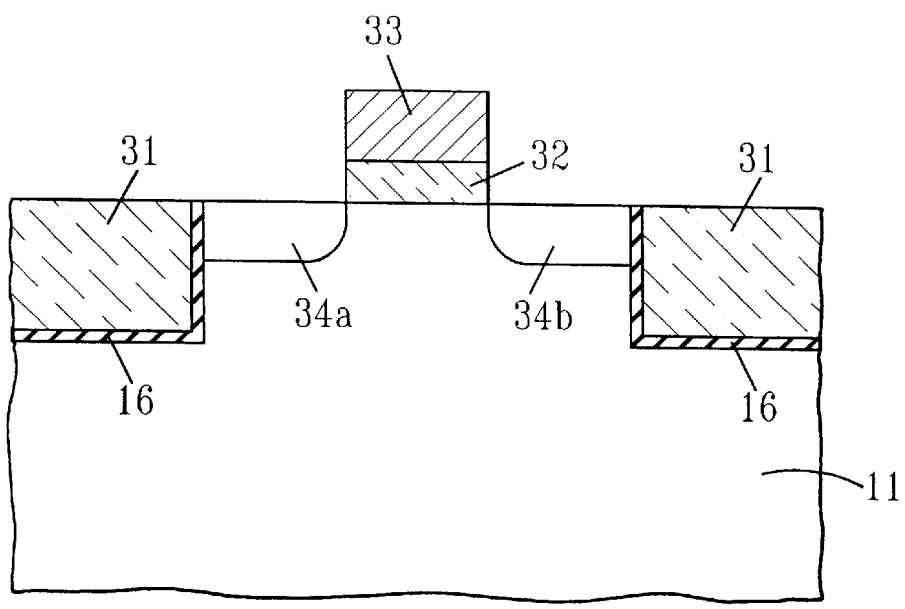
FIG. 3 is a cross-section of a MOSFET formed according to an embodiment of the invention.

Next, the trenches 14 are filled with oxide to form isolations as describe above and conventional processing techniques are carried out to form MOSFETs as shown in FIG. 3. Source/drain regions 34a, b are formed in substrate 11 and gate conductor 33 is formed on gate oxide 32.

Figure 4:
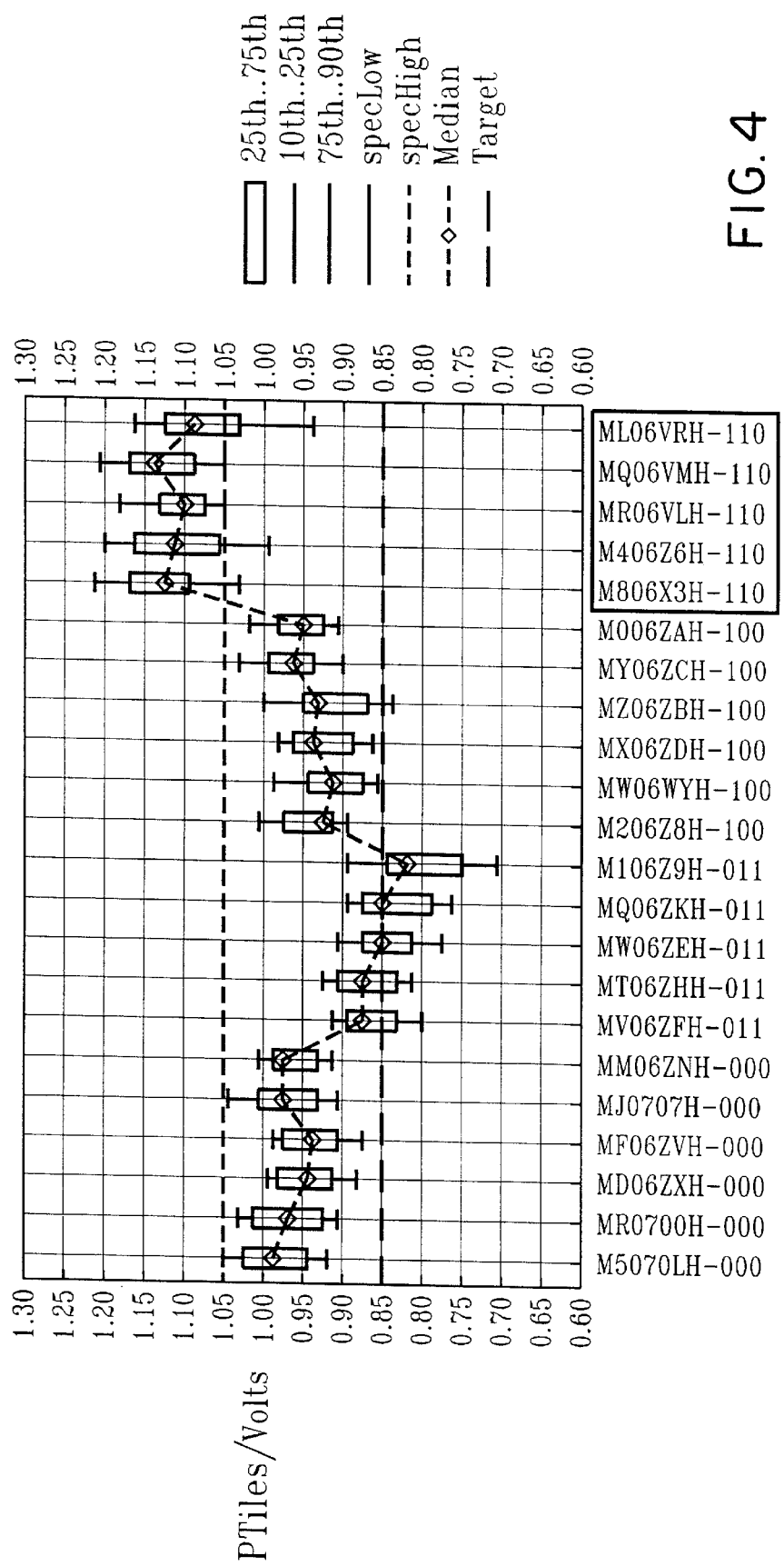
FIG. 4 shows experimental data for a NFET formed according to an embodiment of the invention.
Figure 5:
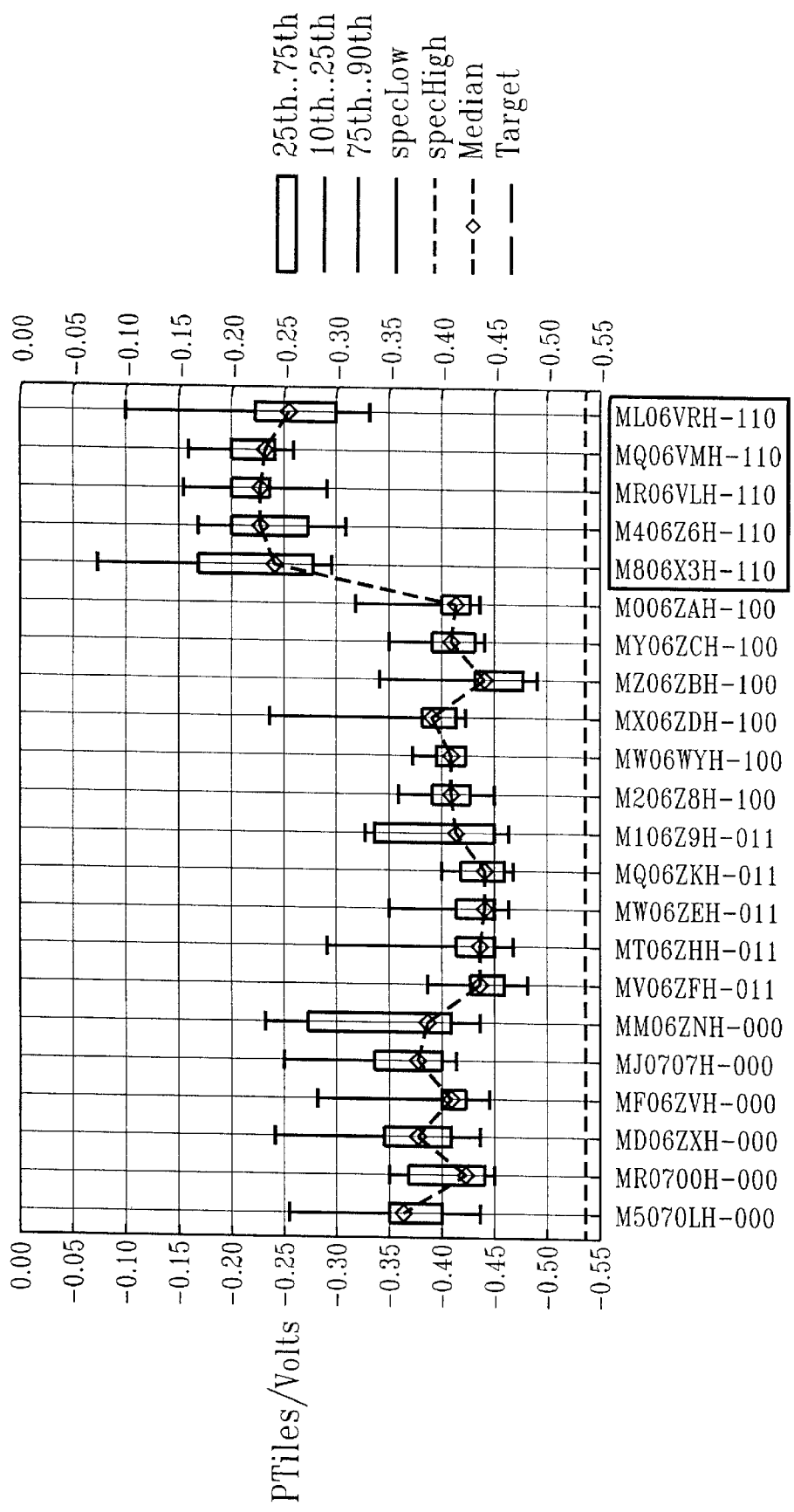
FIG. 5 shows experimental data for a PFET formed according to an embodiment of the invention.
Figure 6:
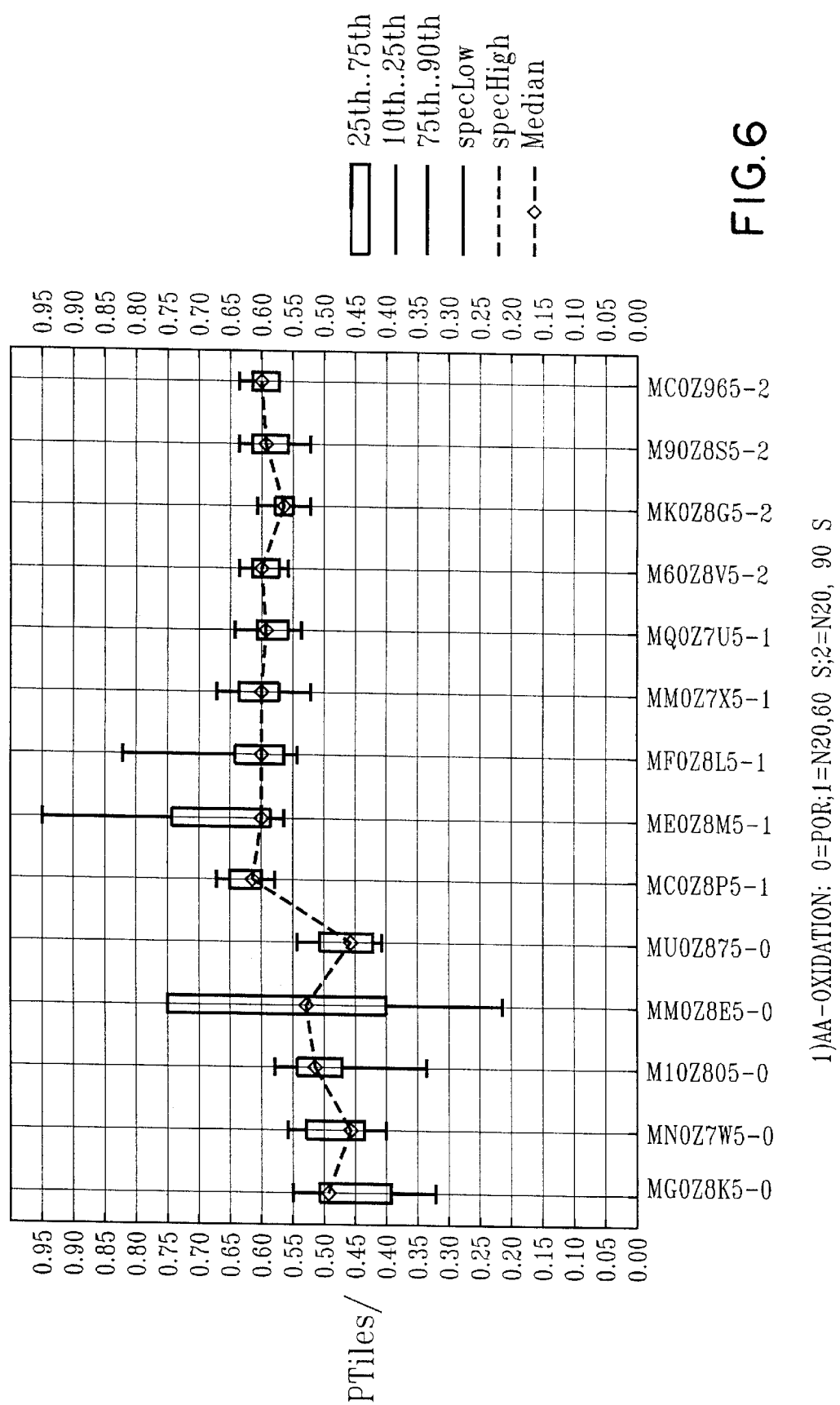
FIG. 6 shows data where the oxide liner and nitride liner are replaced with a nitrided oxide.

FIGS. 4–8 show experimental data resulting from tests performed on a structure according to the present invention. FIG. 4 shows the array corner threshold voltage for various combinations of nitride and oxide liners. It can be seen from FIG. 4 that the array corner threshold increases for semiconductor devices formed with 6 nm oxide liners and 11 nm nitride liners. The array corner threshold voltage increased almost 150 mV in those instances. In conjunction with the PFET support device corner threshold voltage shown in FIG. 5, where the magnitude of the corner threshold voltage is reduced correspondingly, it is clear that the 11 nm nitride liner holds negative charge. Comparing this information to FIG. 7, it can be seen that with a 5.5 nm nitride liner with different oxide liner thicknesses, there is no strong difference in the array threshold. Thus, the negative charge in the nitride liner is insensitive to the oxide liner thickness in the range from 7 nm to 13 nm. Further, as shown in FIG. 6, a nitrided oxide liner also helps increase the array threshold by trapping negative charge. Consequently, the combination of the oxide liner and the nitride liner described above may be replaced with a nitrided oxide.

It is clear from the above the oxide liner and the nitride liner can each have a number of different thicknesses. A thinner oxide liner should greatly enhance the quantity of trapped negative charge due to tunneling probability increasing with oxide liners thinner than 5 nm. The oxide liner should be as thin as possible while still achieving sufficient passivation of the silicon surface, usually less than 10 nm thick. A preferred range of oxide liner thickness is less than 4 nm, for example 1–4 nm. In comparison, there is no upper limit for the nitride liner thickness. It has been observed that the amount of incremental threshold voltage shift tapers off for nitride liner thicknesses between 9 nm and 11 nm. However, there is no deleterious effect for use of thicker nitride liners. The preferred thickness for the nitride liner is greater that 5.5 nm.

Figure 8:
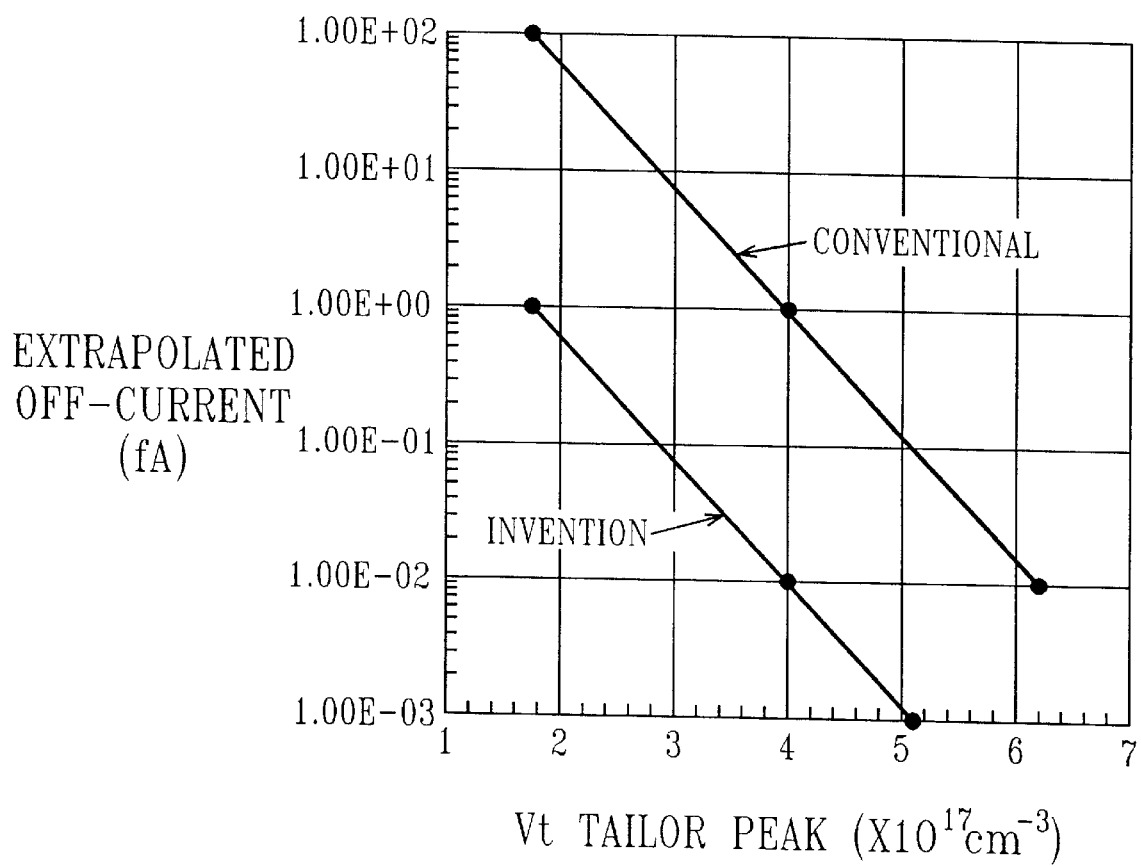
FIG. 8 is a graph showing the relationship between off-current and peak concentration of the implanted array threshold voltage tailoring profile.

FIG. 8 illustrates the experimentally determined relationship between the off-current and the peak concentration of the implanted array threshold voltage tailor profile. Here, the typical dependence between median off-current and Vt profile peak for a DRAM array MOSFET for a conventional device and a device according to the invention is shown. The conventional device has an AA oxide liner about 13 nm thick and a nitride layer about 5.5 nm thick. The device according to the invention has an AA oxide liner about 6 nm thick and a nitride liner about 11 nm thick. In this exemplary case, Tox is 7 nm and the minimum feature size is 200 nm. As can be seen from FIG. 8, for a device according to the present invention the doping concentration in the p-well for a given off-current is reduced compared to a conventional device. The p-well doping may be reduced 30%–50% from that of conventional devices. This is made possible by using the charge trapped in the nitride layer to control the voltage threshold. Thus, the off-current for the present invention is greatly reduced compared to conventional devices.

Accordingly, a device and method for forming the same with reduced off-current has been provided. The reduced off-current is achieved by trapping charges in a nitride liner formed in STI. The trapped charge allows the doping in a p-well to be reduced. Consequently, a higher yield is obtained and junction leakage is decreased.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of manufacturing a semiconductor device, comprising:

forming a trench in a substrate;

forming a nitride liner in the trench, the nitride liner having charges trapped therein, wherein the nitride liner is non-crystalline, and the trapped charge is distributed throughout the nitride liner.

2. The method of claim 1 further comprising forming an oxide liner between the nitride liner and the trench.

3. The method of claim 1 wherein the nitride liner is at least 5.5 nm thick.

4. The method of claim 2 wherein the oxide liner is less than 5 nm thick.

5. The method of claim 1 wherein the nitride liner is formed by LPCVD.

6. The method of claim 1 further comprising filling the trench with an oxide fill.

7. The method of claim 6 wherein the oxide fill is formed directly on the nitride liner.

8. The method of claim 6 wherein the oxide fill is formed by a HDP process.

9. The method of claim 1 wherein the charge trapped in the nitride liner is negative.

10. The method of claim 1 wherein the semiconductor substrate is a p-well.

11. The method of claim 1 wherein the charge trapped in the nitride liner increases a threshold voltage of the device.

12. The method of claim 1 wherein the nitride liner is formed as a nitrided oxide.

13. A method of manufacturing a semiconductor device, comprising:

etching trenches into a semiconductor substrate in an array region and a support region thereof;

forming a non-crystalline nitride liner in the trenches; and depositing an oxide fill in the trench by a high density plasma process to trap negative charge in the nitride liner, at least in the array region.

14. The method of claim 13 further comprising, prior to forming the nitride liner, passivating the substrate to form an oxide film having a thickness less than 10 nm.

15. The method of claim 14 wherein the thickness of the oxide film is less than 4 nm.

16. The method of claim 13 wherein the nitride liner is formed with a thickness greater than 5.5 nm.

17. The method of claim 16 wherein the nitride liner is formed with a thickness greater than or equal to 9 nm.

18. The method of claim 13 wherein doping concentrations in p-wells in the array region are reduced as a function of the trapped negative charge.

19. The method of claim 13 further comprising forming NFETs in the array region and PFETs in the support region.

20. The method of claim 13 wherein the nitride liner is formed by LPCVD.

21. The method of claim 14 wherein the nitride liner and oxide film are formed as a nitrided oxide.

* * * * *